(12) United States Patent
Shubat et al.

(10) Patent No.: US 7,406,620 B2
(45) Date of Patent: *Jul. 29, 2008

(54) SYSTEM AND METHOD FOR COMPILING A MEMORY ASSEMBLY WITH REDUNDANCY IMPLEMENTATION

(75) Inventors: Alex Shubat, Fremont, CA (US); Randall Lee Reichenbach, Seattle, WA (US)

(73) Assignee: Virage Logic Corp., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/503,641

(22) Filed: Aug. 14, 2006

(65) Prior Publication Data

US 2006/0277430 A1 Dec. 7, 2006

Related U.S. Application Data

(63) Continuation of application No. 10/144,020, filed on May 13, 2002, now Pat. No. 7,093,156.

(51) Int. Cl.
*G06F 11/00* (2006.01)

(52) U.S. Cl. .......................... 714/5; 714/710; 714/711; 365/200; 365/201

(58) Field of Classification Search ................ 714/5, 714/42, 711, 718; 365/200
See application file for complete search history.

(56) References Cited

U.S. PATENT DOCUMENTS

| | | | | | |
|---|---|---|---|---|---|
| 5,325,334 | A | * | 6/1994 | Roh et al. | 365/201 |
| 5,337,277 | A | * | 8/1994 | Jang | 365/200 |
| 5,359,560 | A | * | 10/1994 | Suh et al. | 365/200 |
| 5,596,536 | A | * | 1/1997 | Koh | 365/200 |
| 5,796,750 | A | * | 8/1998 | Lottridge et al. | 714/725 |
| 5,831,916 | A | * | 11/1998 | Berger | 365/200 |
| 5,999,463 | A | * | 12/1999 | Park et al. | 365/200 |
| 6,067,268 | A | * | 5/2000 | Lee | 365/225.7 |
| 6,249,465 | B1 | * | 6/2001 | Weiss et al. | 365/200 |
| 6,295,627 | B1 | * | 9/2001 | Gowni et al. | 716/1 |
| 6,505,324 | B1 | * | 1/2003 | Cowan et al. | 716/4 |
| 6,598,190 | B1 | * | 7/2003 | Capocelli et al. | 714/711 |
| 6,603,690 | B1 | * | 8/2003 | Chen et al. | 365/200 |
| 6,704,227 | B2 | * | 3/2004 | Lee | 365/200 |
| 6,757,204 | B2 | * | 6/2004 | Di Ronza et al. | 365/200 |

(Continued)

OTHER PUBLICATIONS

Schrober et al. "Memory Built-In Self-Repair," 13th Workshop—Test Methods and Reliability of Circuits and Systems, Feb. 18-20, 2001.*

*Primary Examiner*—Yolanda L Wilson
*Assistant Examiner*—Philip Guyton
(74) *Attorney, Agent, or Firm*—Danamrj & Emanuelson, P.C.

(57) ABSTRACT

In one embodiment, a computer-implemented system for compiling a fuse assembly for a memory is disclosed. The claimed embodiment comprises: means for defining a memory group including at least one memory instance, each memory instance being characterized by its memory configuration data; means for determining number of fuses required for each memory instance based on its configuration data; means for automatically passing fuse information relating to the number of fuses to a fuse compiler; and means for generating, based on the fuse information, a fuse box assembly having a plurality of fuses organized into a set of fuse segments, each segment corresponding to a particular memory instance of the memory group.

8 Claims, 8 Drawing Sheets

U.S. PATENT DOCUMENTS 6,973,605 B1 * 12/2005 Templeton et al. .......... 714/718
2003/0026147 A1 * 2/2003 Bang et al. ................. 365/201
2004/0136258 A1 * 7/2004 Ishikawa ............... 365/230.03

* cited by examiner

SYSTEM AND METHOD FOR COMPILING A MEMORY ASSEMBLY WITH REDUNDANCY IMPLEMENTATION

CLAIM OF PRIORITY UNDER 35 U.S.C. §120 & 37 C.F.R. §1.78

This nonprovisional application is a continuation application claiming the benefit of the following prior U.S. patent application entitled: EMBEDDED TEST AND REPAIR SCHEME AND INTERFACE FOR COMPILING A MEMORY ASSEMBLY WITH REDUNDANCY IMPLEMENTATION, filed May 13, 2002, application Ser. No.: 10/144,020, now U.S. Pat. No. 7,093,156, in the name(s) of: Alexander Shubat and Randall Lee Reichenbach, which is hereby incorporated by reference.

BACKGROUND

1. Technical Field of the Invention

The present disclosure relates generally to semiconductor memories. More particularly, and not by way of any limitation, the present disclosure is directed to a system and method for compiling a memory assembly with redundancy.

2, Description of Related Art

Silicon manufacturing advances today allow true single-chip systems to be fabricated on a single die (i.e., System-On-Chip or SOC integration). However, there exists a "design gap" between today's electronic design automation (EDA) tools and the advances in silicon processes which recognizes that the available silicon real-estate has grown much faster than has designers' productivity, leading to underutilized silicon. Unfortunately, the trends are not encouraging: the "deep submicron" problems of non-convergent timing, complicated timing and extraction requirements, and other complex electrical effects are making silicon implementation harder. This is especially acute when one considers that analog blocks, non-volatile memory, random access memories (RAMs), and other "non-logic" cells are being required. The gap in available silicon capacity versus design productivity means that without some fundamental change in methodology, it will take hundreds of staff years to develop leading-edge integrated circuits (ICs).

Design re-use has emerged as the key methodology solution for successfully addressing this time-to-market problem in semiconductor IC design. In this paradigm, instead of re-designing every part of every IC chip, engineers can re-use existing designs as much as possible and thus minimize the amount of new circuitry that must be created from scratch. It is commonly accepted in the semiconductor industry that one of the most prevalent and promising methods of design re-use is through what are known as Intellectual Property ("IP") components—pre-implemented, re-usable modules of circuitry that can be quickly inserted and verified to create a single-chip system. Such re-usable IP components are typically provided as megacells, cores, macros, embedded memories through generators or memory compilers, et cetera.

It is well known that memory is a key technology driver for SOC design. Although providing high quality embedded memory IP in SOC applications poses several challenges, the total density of embedded memory has been increasing rapidly. It should be appreciated that without the use of redundancy, the fabrication yields of SOC devices and other embedded memory systems will be very low.

Several techniques exist for providing redundancy in conventional memory design methodologies. In fact, such redundancy techniques have been largely responsible for the ever-increasing densities of the single-chip memories. Incorporating conventional redundancy schemes in embedded memory IP applications, however, has numerous deficiencies. First, such schemes provide a cost-effective solution only when the memory density is greater than a certain minimum number of bits. If the support circuitry needed for redundancy occupies more than 5% of the memory array area, the design is generally considered area-inefficient.

It should be apparent that such area requirements pose a significant difficulty in the field of embedded memory design. For example, the embedded memories are typically provided in various sizes (i.e., densities) and aspect ratios, and are distributed throughout the system (i.e, several memory instances may co-exist). The requirement of redundancy in smaller memory instances, accordingly, would result in an unacceptably large redundancy overhead (i.e., high area-inefficiency).

Further, conventional redundancy techniques typically involve placing fuse elements within the memory array for effectuating row or column redundancy. In general, they are placed in row decoders, storage areas for faulty addresses, column fuse banks, et cetera. Those skilled in the art should recognize that such schemes give rise to inefficient layouts because routing over fuse areas is not permitted, thereby causing routing congestion and related "place and route" problems. Also, because of the routing bottlenecks around the fuse areas, creating multi-level power grids may not be feasible in SOC circuits.

In addition, where laser-activated fuse technology is used, there are limits to how small such a fuse element needs to be. Accordingly, the size of fuse elements does not scale in correspondence with the size of memory core cells. Relatedly, the pitch of fuses normally does not match the pitch of memory cells. As a result, it would be very difficult to tile fuses and connect them appropriately in a dense periphery layout.

To address these and other redundancy-related issues, memory design techniques have been developed by the assignee of the present patent application wherein memory compilers are provided with the capability to configure fuse elements or other volatile storage elements outside the memory core that are capable of storing a repair signature. Such a repair signature can be used for hard repair (via fuse element data) or for soft repair (via volatile storage element data) of faulty locations. Although such techniques provide significant advantages, fuse compilers associated therewith for compiling an array of fuses with respect to one or more memory instances are beset with certain drawbacks. First, the fuse compiler system and user interface associated therewith are not easily adaptable to variable memory configurations. As is common in the semiconductor memory art, end users implementing a particular memory application by way of a compiler design may sometimes have to reconfigure the memory instances, including the redundancy requirements, in order to customize the application. When such modifications are made, the fuse count should also track the corresponding changes in the redundancy structures. Otherwise, an inaccurate fuse count will result, which renders the devices only partially functional at best or defective in general. Accordingly, the overall device yield will be negatively impacted. It should further be appreciated that because the performance requirements are stringent in all memory applications, even a single fuse missing in the required fuse count for a memory device will have significant consequences. In addition, more importantly, existing fuse compiler design techniques are not integrated with embedded memory test and repair methodologies in a satisfactory manner. Finally, some of these aforesaid concerns are also prevalent in situations where the repair signatures are stored in volatile registers for soft repair.

SUMMARY

In one embodiment, a computer-implemented system for compiling a fuse assembly for a memory is disclosed. The claimed embodiment comprises: means for defining a memory group including at least one memory instance, each memory instance being characterized by its memory configuration data; means for determining number of fuses required for each memory instance based on its configuration data; means for automatically passing fuse information relating to the number of fuses to a fuse compiler; and means for generating, based on the fuse information, a fuse box assembly having a plurality of fuses organized into a set of fuse segments, each segment corresponding to a particular memory instance of the memory group.

In another embodiment, disclosed herein is a computer-implemented system for generating a self-test-and-repair (STAR) memory system including a plurality of memory instances. The claimed embodiment comprises: means for specifying a memory group that includes the plurality of memory instances, each memory instance being characterized by its memory configuration data; means for specifying a fuse compiler that automatically generates a fuse box having a number of fuses required for each memory instance based on its configuration data; and means for specifying a processor compiler associated with the memory group, the processor for effectuating an embedded test and repair functionality with respect to the memory instances.

In a still further aspect, an embodiment of the present disclosure is directed to a user interface for facilitating a fuse assembly compiling process associated with a memory architecture, comprising: means for defining, via the user interface, a memory group including at least one memory instance, each memory instance being characterized by its memory configuration data; and means for automatically passing a number of fuses to a fuse compiler, wherein the number of fuses required for each memory instance is determined based on its configuration data.

In yet another aspect, the present disclosure is directed to a computer program product that includes a computer usable medium having computer readable program code for facilitating a fuse assembly compiling process associated with an integrated circuit. The claimed embodiment comprising: program code operable to support a graphical user interface portion for specifying a memory group that includes a plurality of memory instances, each memory instance being characterized by its memory configuration data; program code operable to support a graphical user interface portion for specifying a fuse compiler that automatically generates a fuse box having a number of fuses required for each memory instance based on its configuration data; and program code operable to support a graphical user interface portion for specifying a processor compiler associated with the memory group, the processor for effectuating an embedded test and repair functionality with respect to the memory instances.

BRIEF DESCRIPTION OF THE DRAWINGS

A more complete understanding of the present disclosure may be had by reference to the following Detailed Description when taken in conjunction with the accompanying drawings wherein.

DETAILED DESCRIPTION OF THE DRAWINGS

Figure 1:
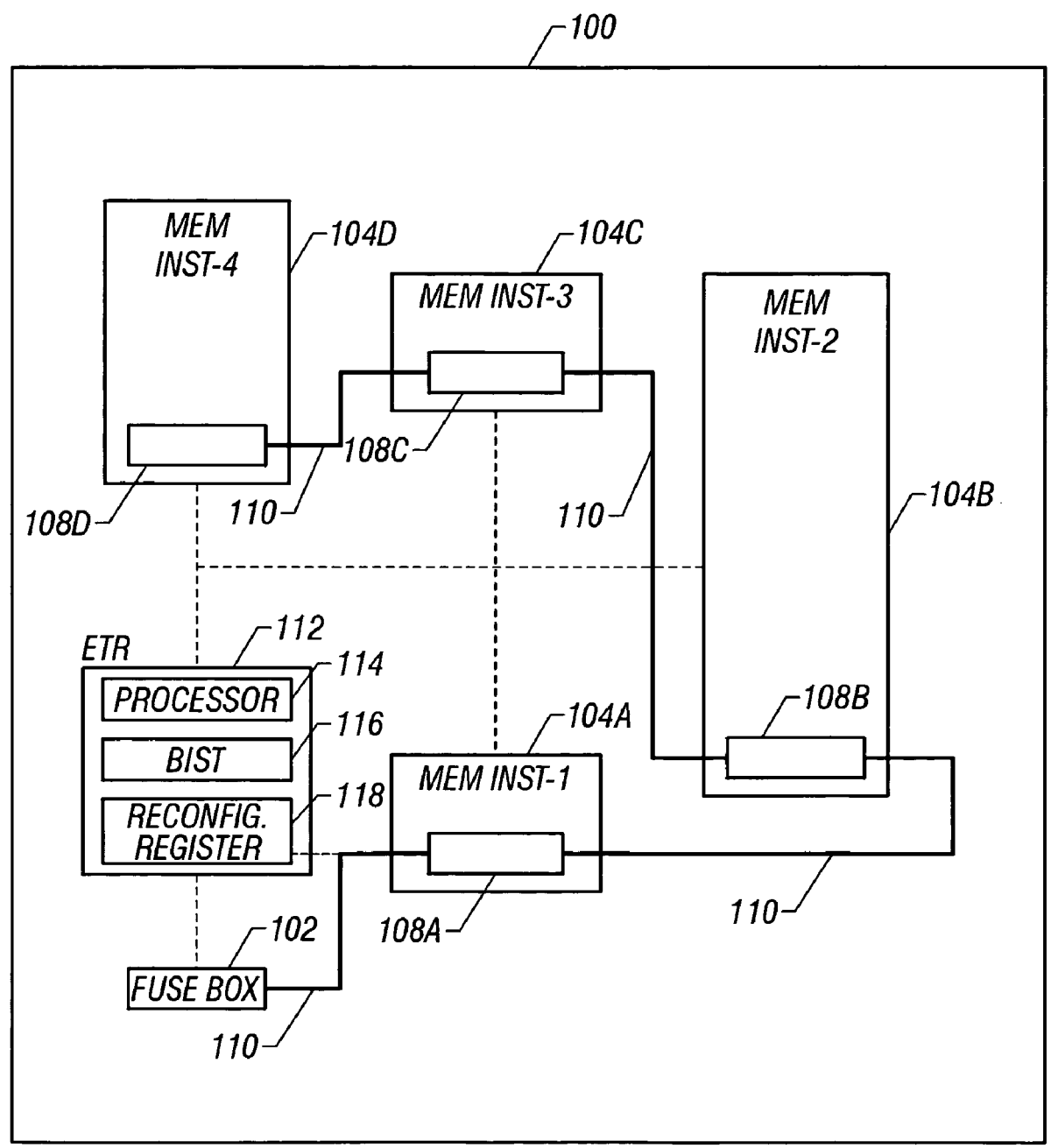
FIG. 1 depicts an exemplary embodiment of a multi-instance memory device, preferably a self-test and repair (STAR) memory device, wherein the teachings of the present disclosure may be advantageously practiced.

In the drawings, like or similar elements are designated with identical reference numerals throughout the several views thereof, and the various elements depicted are not necessarily drawn to scale. Referring now to FIG. 1, depicted therein is an exemplary embodiment of an integrated circuit device 100 wherein the teachings of the present disclosure may be advantageously practiced. In one presently preferred implementation, the device 100 may be comprised of an SOC device having a plurality of memory instances embedded therein. More particularly, in a still further exemplary embodiment, the device 100 may be a Self-Test and Repair (STAR) memory device having Embedded Test and Repair (ETR) functionality 112. It is envisaged that the STAR memory device 100 is preferably operable as an embedded memory product that allows design engineers to economically embed multiple memory instances into a SOC. As an embedded solution, STAR memory device 100 supports cost-effective embedding, testing and repairing of multi-megabit memories. Reference numerals 104A through 104D refer to four such memory instances wherein redundancy is implemented. Each memory instance may be comprised of any known or heretofore unknown architecture and technology, and includes a primary or main array (not explicitly shown) and a redundant portion (either redundant rows, redundant columns, or both) in any manner or configuration. Accordingly, the memory instances may be selected from the group including static random access memory (SRAM) instances, dynamic RAM (DRAM) instances, electrically programmable read-only memory (EPROM) instances, Flash memory instances, and the like. Further, each of the memory instances is provided with a volatile storage element (e.g., registers 108A through 108D) whose size corresponds to the size of the redundant portion or portions disposed therein. Those skilled in the art should therefore recognize that the redundant portions are not required to be of the same size for the memory instances.

An array of fuses 102, as characterized by an optional fuse box, is provided for facilitating hard repair of faulty locations. Preferably, the fuse array is disposed external to the memory instances of the device 100. That is, in the terminology of memory compiler art, the fuse box array or assembly 102 is provided outside the memory macro or core corresponding to the memory instances, whereby all the fuse elements necessary for effectuating redundancy in the memory instances are grouped together for storing information pertaining to faulty memory locations therein. Essentially, as those skilled in the art will recognize, a fuse is a layout feature which can be "blown" or otherwise activated to achieve post-fabrication programming required for implementing redundancy in factory testing. Further, in the context of the present patent application, a memory compiler is a compiler (IP plus software) used in generating a configurable memory instance.

Where applicable, the multiple instances 104A-104D are daisy-chained with the fuse box 102 via a signal path 110, in addition to being coupled to certain ENABLE and CLOCK signals. Signals effectuated on these signal paths are used, preferably upon power-up followed by a reset of the device 100, for transferring or scanning out the contents of the fuse elements in the fuse box assembly 102 to the volatile registers 108A-108D disposed in the memory instances 104A-104D, respectively. The contents of an individual register are then used for effectuating row redundancy (wordline replacement), column redundancy (bitline replacement), or both, in a particular memory instance associated therewith.

It should be recognized that the fuse box assembly design as set forth hereinabove is highly scalable. As is well-known in the semiconductor industry, the benefits of design re-use are maximized when an IP core is usable in and adaptable to several configurations and applications. Since the placement of fuse elements is no longer coupled with the memory instances, and because any number of fuses can be easily tiled together, extraordinary flexibility is readily obtained in the redundancy implementation scheme of the present disclosure. It should further be appreciated that the active logic area associated with the fuse box 102 remains relatively constant, which includes such components as drivers, clock circuitry, reset circuitry, et cetera. Each field of fuses, preferably provided as a segment of redundancy scan (RSC) flip-flops (FFs) that corresponds to a memory instance, may be viewed as a highly scalable ohmic component tile that can be configured to suit different memory applications without any significantly deleterious effect on performance. Additional details regarding the fuse box design for multi-instance redundancy implementation may be found in the following commonly owned U.S. Pat. No. 6,360,020, titled: "Architecture With Multi-Instance Redundancy Implementation," which is hereby incorporated by reference herein.

An ETR engine 112 is preferably included as part of the STAR memory device 100 in order to support integrated test and repair capability. It should be appreciated by those skilled in the art that such integrated functionality ensures higher yielding semiconductors, and can potentially save considerable expenditures by way of recovered silicon, substantially reduce test costs, and enable faster time to volume marketing. In general, repair functionality may be implemented either in the factory during wafer probe (hard repair) or in the field while the SOC device is used in the end product (sort repair).

The ETR block 112 is preferably comprised of a processor 114 that can test and repair one or several memory instances running in parallel. Also, a Built-In Self-Test (BIST) block 116 is provided as part of the integrated ETR functionality. To facilitate soft repair, a volatile reconfiguration register (RECONFIG. REGISTER or RR) 118 is included in the ETR engine functionality. The volatile RR element 118 is operable to store an appropriate repair signature obtained during power-up of the device in the field. As will be seen below, the ETR engine is preferably adjustable based on the number of memory instances, sizes and memory configuration data.

An interface hereinafter referred to as "Intelligent Wrapper" or IW (not shown in this FIG.) is associated with each memory instance, and is used in conjunction with the processor and BIST to perform test and repair of the various memories as well as allow normal memory operations of the system. As will be described in greater detail hereinbelow, the ETR scheme and interface of the present disclosure advantageously provides an automatic methodology for compiling the memory instances, appropriate BIST elements, fuse box (FB) elements (for hard repair option) and reconfiguration register (RR) elements (for soft repair option), and associated processor(s) in a single group so that robust and error-free integration (i.e., "push button integration") can be achieved.

Figure 2:
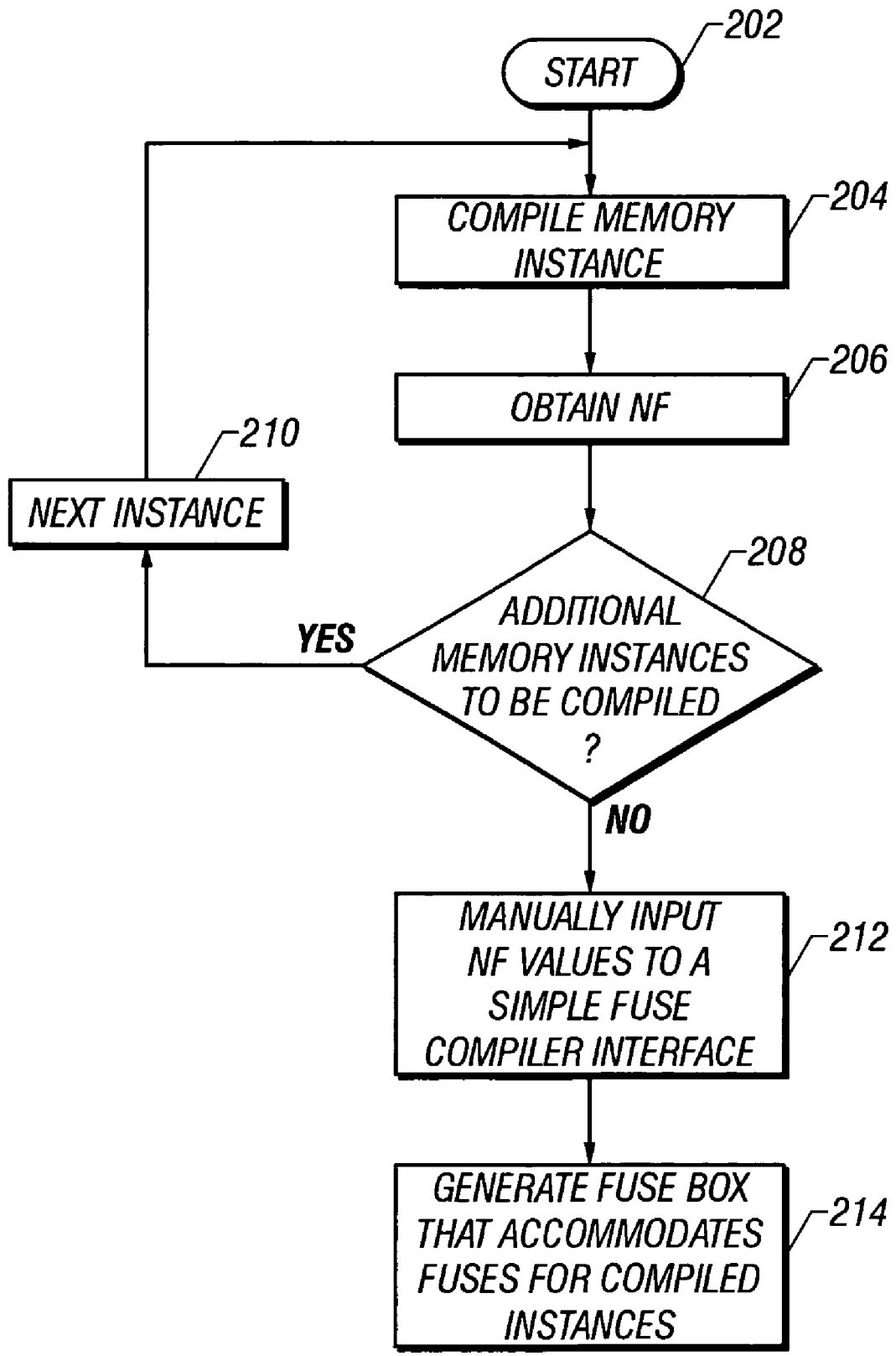
FIG. 2 (Prior Art) is a flow chart of the various steps involved in a conventional methodology for compiling a fuse assembly that accommodates the fuse requirements of multiple memory instances.

FIG. 2 is a flow chart of the various steps involved in a conventional methodology for compiling a fuse box assembly that accommodates the fuse requirements of a device having multiple memory instances. Upon starting the procedure (step 202), a single memory instance is compiled using its memory compiler (step 204). Appropriate memory configuration data (that is, the Number of Words (NB), Number of Bits (NB), column MUX information, memory banking options, subword options, etc.) is provided via a suitable interface for obtaining the Number of Fuses (NF) required for that particular memory instance (step 206). If additional memory instances are to be compiled, as determined by decision block 208, memory configuration data for the next memory instance is supplied (step 210) for determining its NF.

Upon obtaining the NF value associated with each memory instance, the NF values are typically provided to a fuse compiler (a specialized version of a memory compiler particularly optimized for generating a configurable fuse box assembly) via a manual interface (step 212). Based on the individual NF values, the fuse compiler is operable to generate a fuse box having a plurality of fuses that correlate with the redundancy requirements of the compiled instances (step 214).

Figure 3:
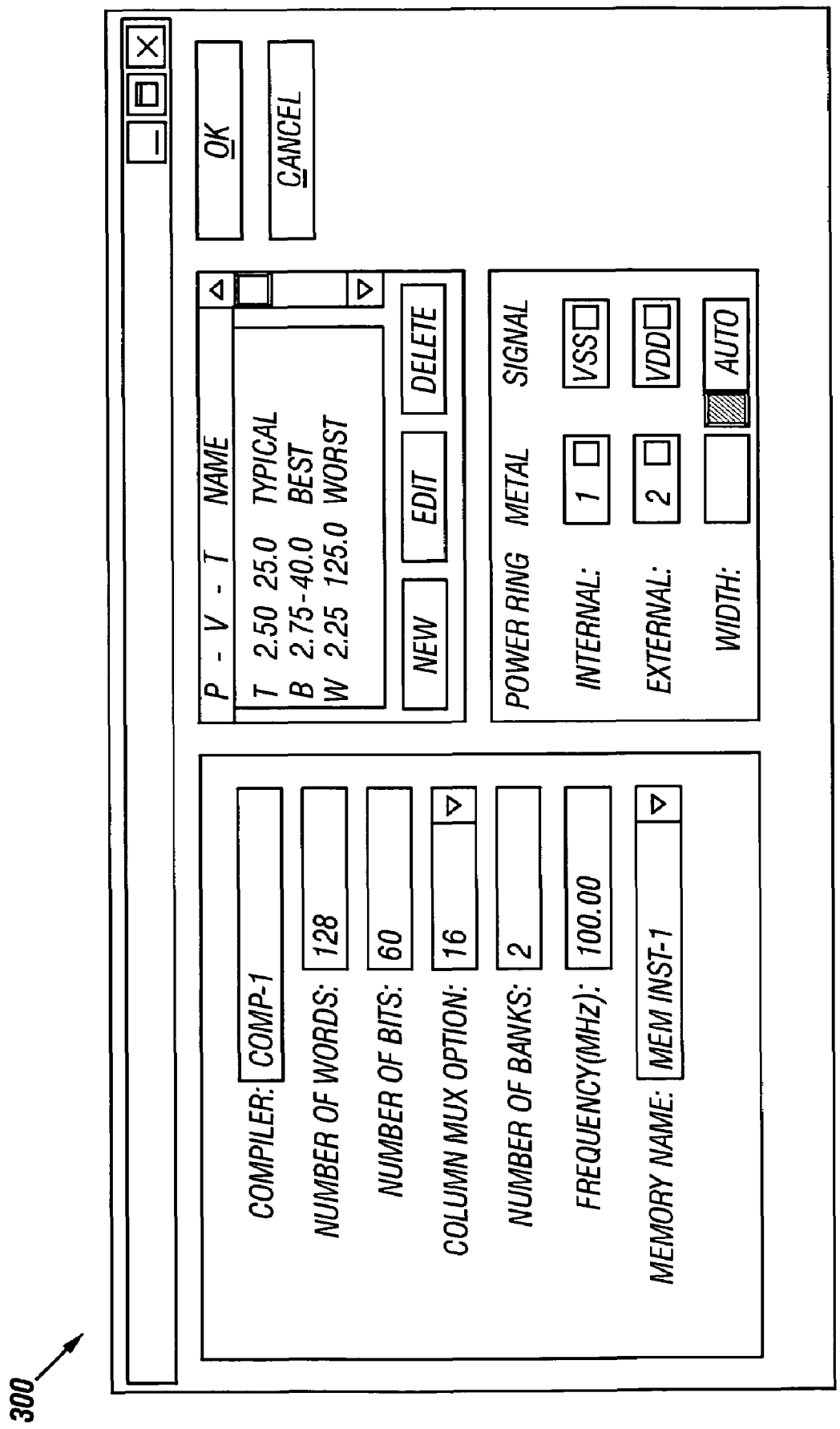
FIG. 3 depicts an exemplary user interface operable with a single instance memory compiler.

Referring now to FIG. 3, depicted therein is an exemplary user interface 300 operable with a single-instance memory compiler. A dialog box is provided wherein the single memory instance can be configured by specifying the number of words, number of bits, MUX option, and the number of banks, if any, in the appropriate fields of the dialog box interface. A specific memory instance and its compiler are selectable via separate fields labeled MEMORY NAME and COMPILER. Applicable frequency data, electrical signal data, power ring data, metal layer data may also be provided via suitable fields of the interface 300.

Figure 4:
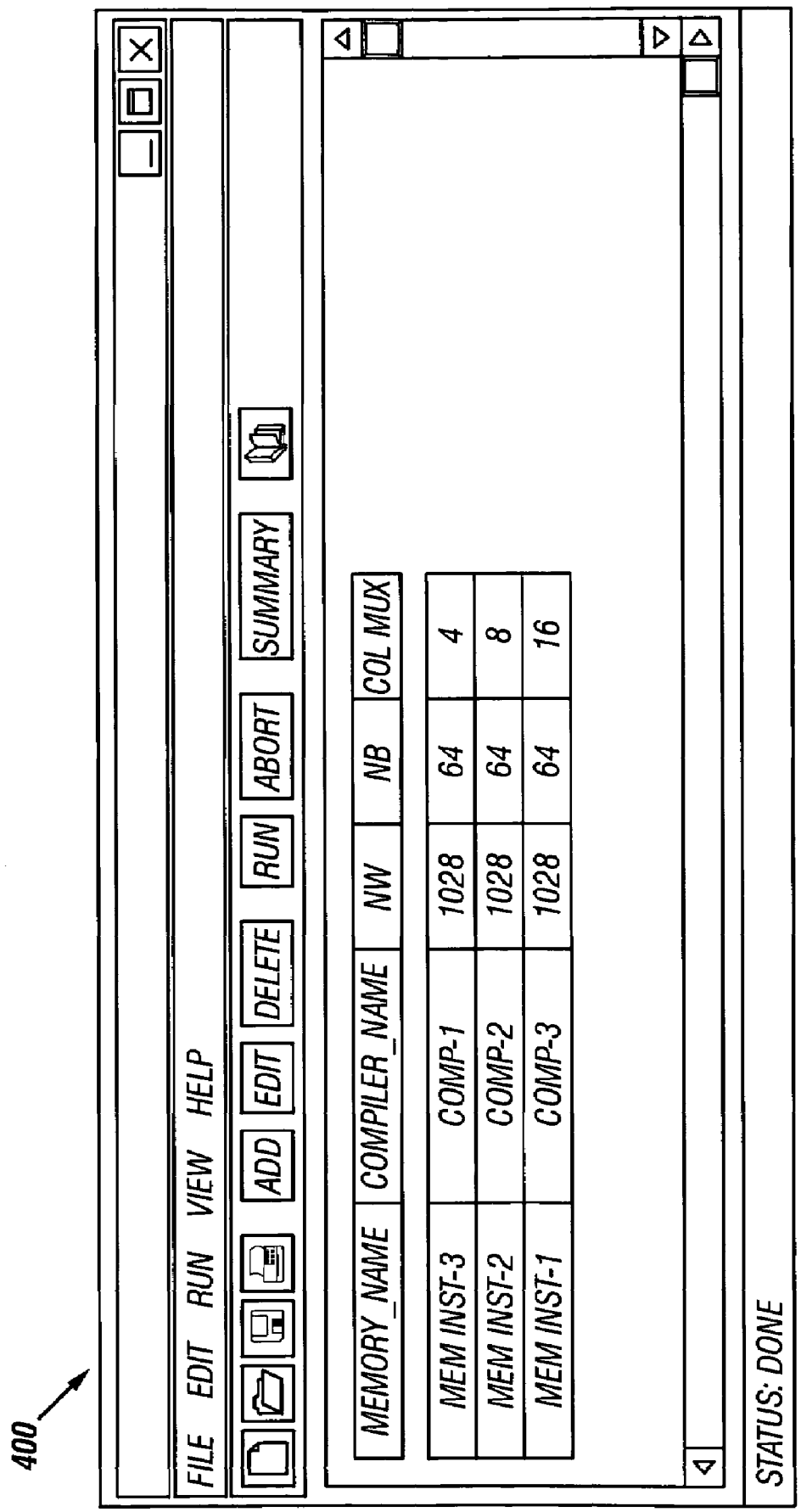
FIG. 4 depicts an exemplary user interface operable with a multi-instance memory compiler.

FIG. 4 depicts an exemplary user interface 400 which allows a collection of memory instances to be configured and generated. Generally, multiple compilers may be used within the collection wherein the multiple instances have no functional relationship to one another. Each memory instance is specified by its name, applicable compiler, and associated configuration data by means of respective fields: MEMORY_NAME, COMPILER_NAME, NW, NB, and COL MUX. After each memory instance is compiled, its NF value is computed and provided as output to the user. Thereafter, individual NF values may be manually provided to a fuse compiler for generating a composite fuse box sufficient to accommodate the fuse requirements of the multiple memory instances.

As briefly alluded to in the Background section of the present patent application, there exist several shortcomings in the current compiler methodology as applied to the multi-instance redundancy architectures set forth hereinabove. Those skilled in the art should readily recognize that one of the more significant drawbacks is the inability to efficiently reconfigure a multi-instance memory compiler when a particular application requires such reconfiguration. Typically, such a process is comprised of tedious manual operations and, accordingly, highly error-prone because of inherent human error (e.g., forgetting to update the required number of fuse elements and/or reconfiguration register elements when memory configurations are changed).

Figure 5:
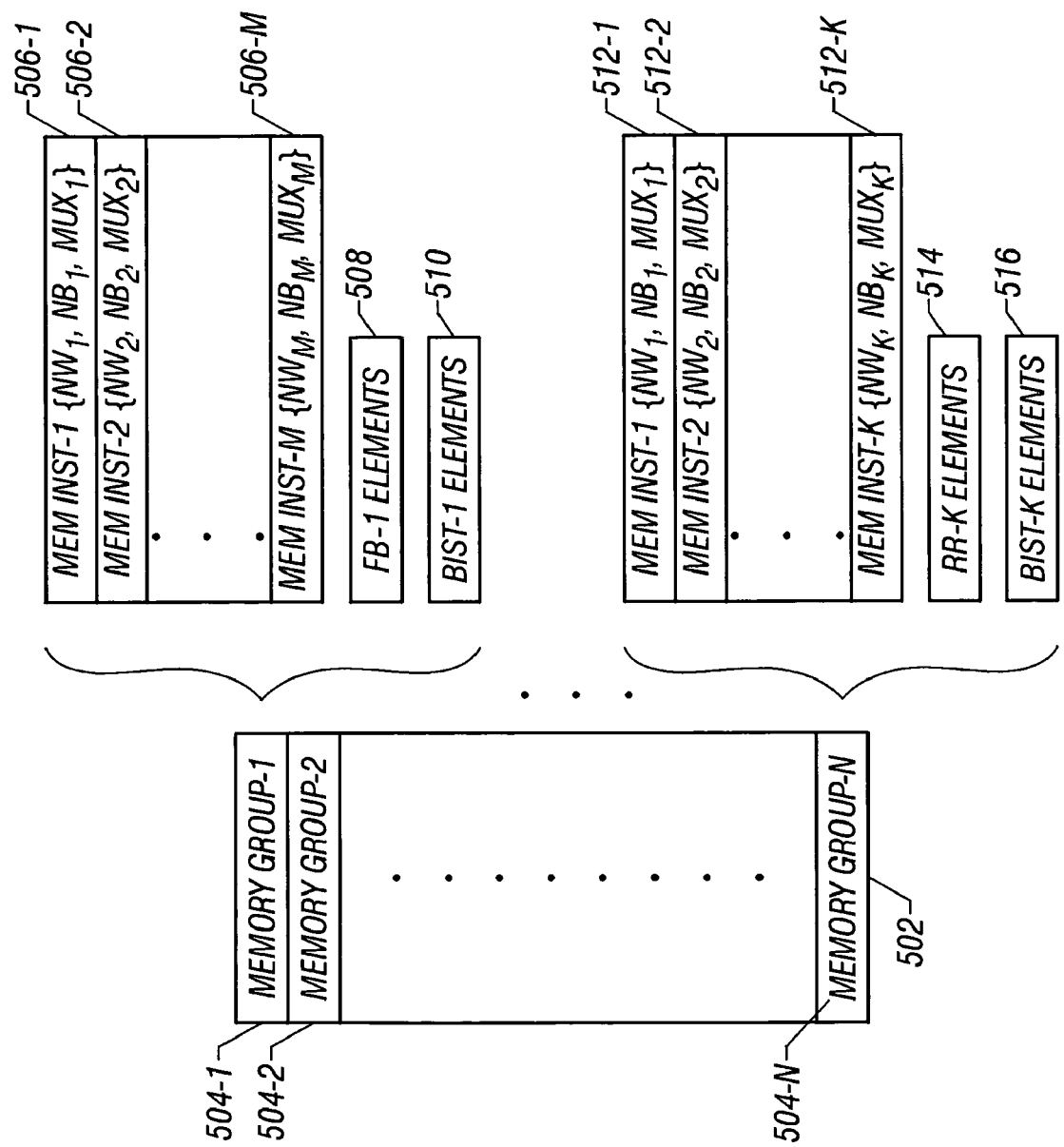
FIG. 5 is a high-level conceptual scheme for defining a memory group in accordance with one embodiment of the present disclosure.

Referring now to FIG. 5, depicted therein is a high-level conceptual scheme for defining a memory group in accordance with one embodiment of the present disclosure, wherein one or more memory instances are provided that are functionally related and can be tested/repaired using ETR functionality. A memory group assembly 502 may be comprised of a plurality of memory groups, e.g., Group-1 504-1 through Group-N 504-N. Each memory group includes a hierarchical grouping of related memory instances, Built-In Self-Test (BIST) elements, fuse box (FB) elements and/or RR elements. For example, Group-1 504-1 is comprised of M instances (reference numerals 506-1 through 506-M), FB-1 elements 508 and BIST elements 510. In similar fashion, Group-N comprises K related instances (reference numerals 512-1 through 512-K), RR-K elements 514 and associated BIST elements 516. In one presently preferred exemplary implementation, the BIST methodology uses the array of fuses (FB elements) to achieve the post-fabrication redundancy programming as needed. The individual fuses within the fuse box are assigned to (i.e., connected to) one or more instances in accordance with the volatile scan registers therein. Likewise, the RR elements are used to provide repair signature data to the memory instances pursuant to soft repair.

Each memory instance of the memory group is specified by its configuration data, i.e., NW, NB and MUX information. Preferably, the FB element of a memory group is comprised of the total number of fuses which is obtained by summing the NF values of the memory instances therein.

Figure 6A:
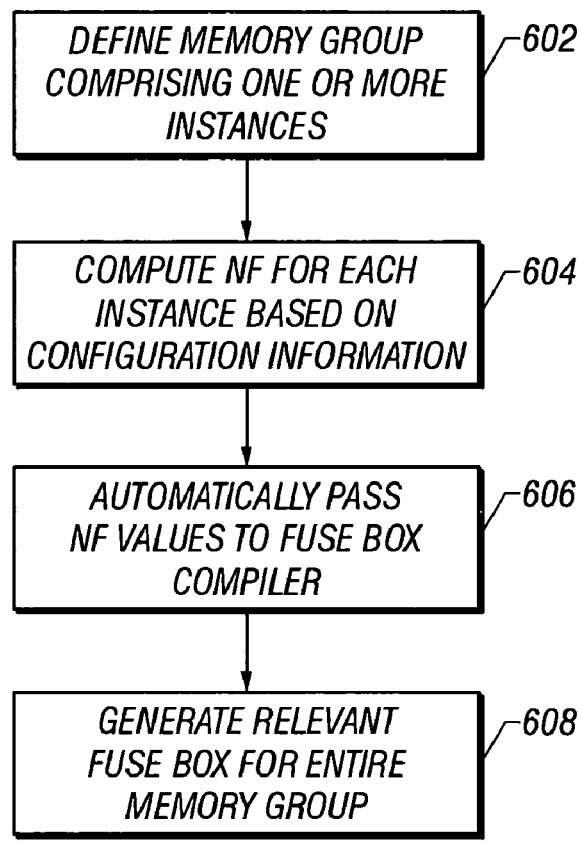
FIG. 6A is a flow chart of the steps involved in an exemplary scheme for compiling a memory group and associated embedded test and repair (ETR) methodology for providing a hard repair option in accordance with the teachings of the present disclosure.

FIG. 6A is a flow chart of the steps involved in an exemplary scheme for compiling a memory group and associated ETR methodology for providing a hard repair option in accordance with the teachings of the present disclosure. A memory group comprising one or more functionally related memory instances is first defined via a suitable user interface (step 602). Each memory instance is characterized by its configuration data. Fuse requirements (i.e., the number of fuses or NF) for each of the instance are then determined based on the configuration data, preferably by employing a suitable fuse equation (step 604). In an exemplary embodiment, the fuse equation is implemented as a mathematical equation based on memory architecture and associated configuration information supplied to the compiler that is used for generating the memory instance. An illustrative fuse equation may take the following form:

$$NF = \log_2[(NW/CM/4)+1] \times 2$$

Preferably, the fuse equation is stored as a parameter within the memory compiler. A fuse map is used to indicate to which memory instance the individual fuses within a fuse box assembly are assigned. In one implementation, the fuse map is constructed essentially as an ordered list of the memory instances associated with a fuse box and an integer value indicating the number of fuses which need to be connected to each instance. Generically, the fuse map comprises the following form: $\{<\text{INST\_NAME1}>:<NF_1> <\text{INST\_NAME2}>:<NF_2>\ldots <\text{INST\_NAME\_M}>:<NF_M>\}$. As a specific example, the following fuse map {MEMORY-1:256 MEMORY-2:128 MEMORY-3:64} assigns fuses 0 through 255 to MEMORY-1, fuses 256 through 383 to MEMORY-2, and fuses 383 through 447 to MEMORY-3 of the memory group.

Upon constructing the fuse map, the NF values are automatically passed to a fuse box compiler that is integrated within the memory compiler interface (step 606). A relevant fuse box assembly is then generated by adding the individual fuse numbers needed by each memory instance within the memory group as per the fuse map (step 608). In other words, once a memory group is defined with a set of memory instances, the user interface allows for automatically calling an appropriate fuse equation for each instance to calculate the NF value based on its configuration data, which value is then used for constructing the requisite fuse map. Thereafter, the dialog box interface takes the fuse map and configures the fuse compiler with the total number of fuses for the entire memory group.

Figure 6B:
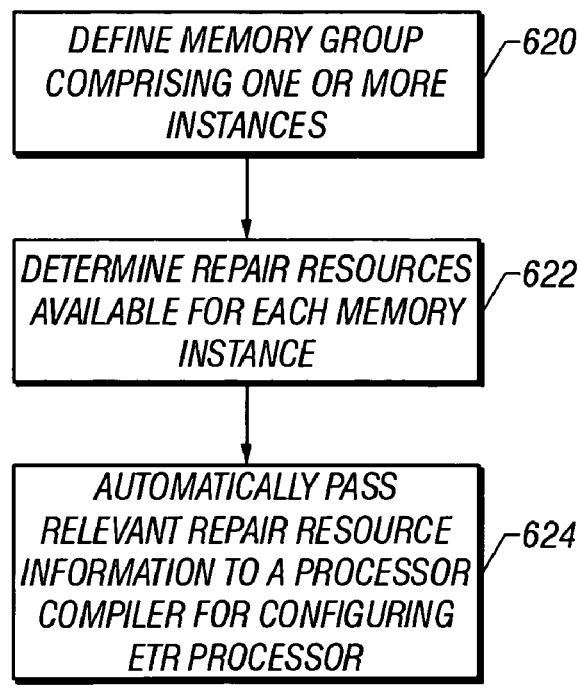
FIG. 6B is a flow chart of the steps involved in an exemplary scheme for compiling a memory group and associated ETR methodology for supporting a soft repair option in accordance with the teachings of the present disclosure.

FIG. 6B is a flow chart of the steps involved in an exemplary scheme for compiling a memory group and associated ETR methodology for supporting a soft repair option in accordance with the teachings of the present disclosure. As before, a memory group comprising one or more functionally related memory instances is first defined via a suitable user interface (step 620), wherein each memory instance is characterized by its configuration data. In step 622, repair resources available in each of the memory instances (i.e., volatile redundancy registers, number of redundant rows, number of redundant columns, et cetera) is determined. Thereafter, information pertaining to the available repair resources is automatically passed via an integrated user interface (which may include a soft repair option in addition to a hard repair option) to a processor compiler for compiling a suitable ETR engine block having the capability to repair the memory instances (step 624).

Figure 7:
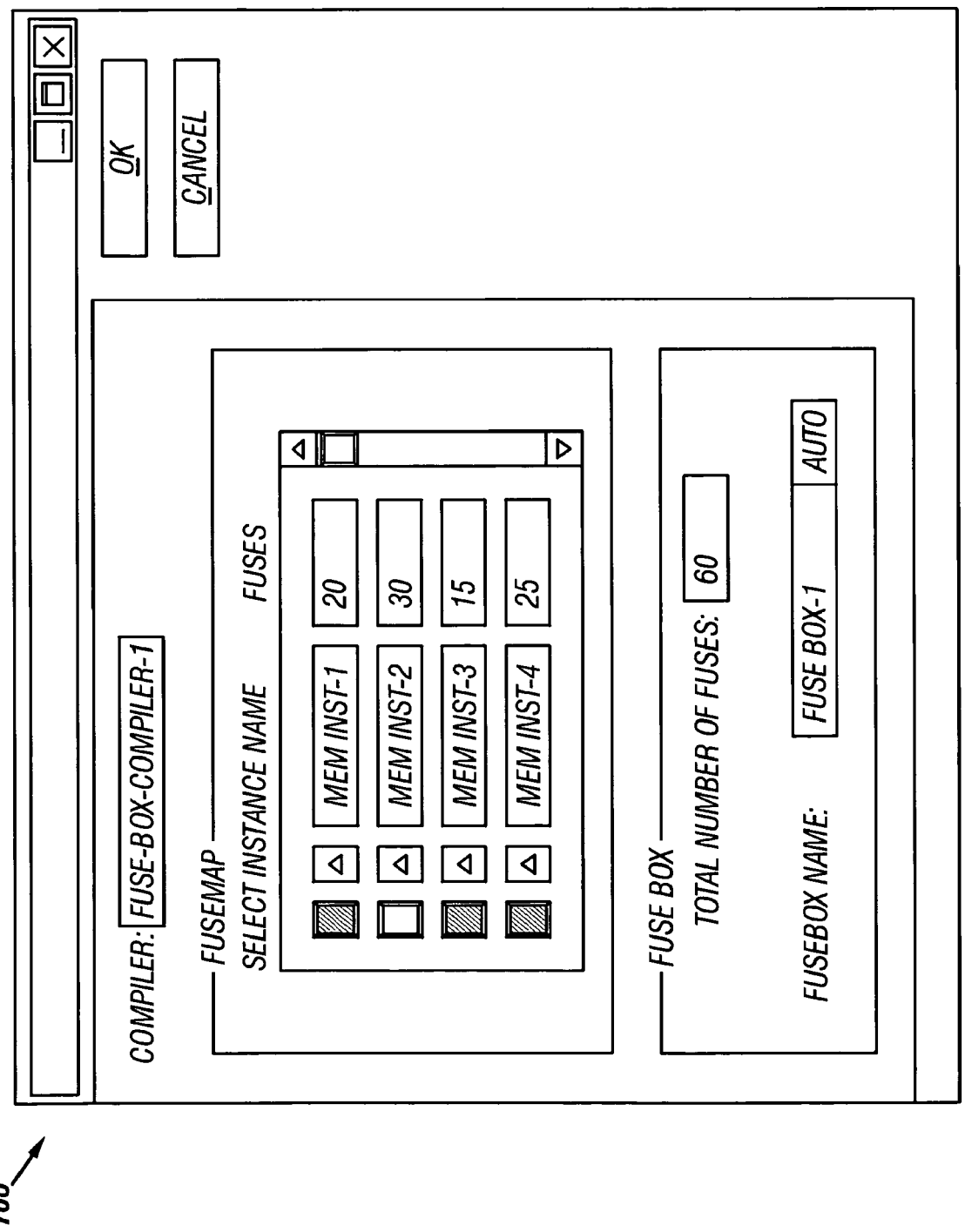
FIG. 7 depicts an exemplary user interface for compiling a fuse box in accordance with the teachings of the present disclosure.

Referring now to FIG. 7, depicted therein is an exemplary user interface 700 associated with a fuse compiler for compiling a fuse box in accordance with the teachings of the present disclosure. A plurality of fields are provided in the user interface dialog box for selecting and ordering one or more memory instances that form a memory group. A FUSE MAP field includes the selected instances and associated fuse information. A separate field is provided for indicating the total number of fuses computed based on the individual number of fuses that are provided via the FUSE MAP field. As set forth hereinabove, a fuse equation corresponding to each memory instance is called to calculate the number of fuses for that instance. The resultant fuse map (exemplified by the FUSE MAP field) is automatically passed to the fuse compiler for generating a fuse box assembly having a plurality of fuses that are organized into a number of segments, wherein each segment corresponds to a particular memory segment as per the fuse map information.

Figure 8:
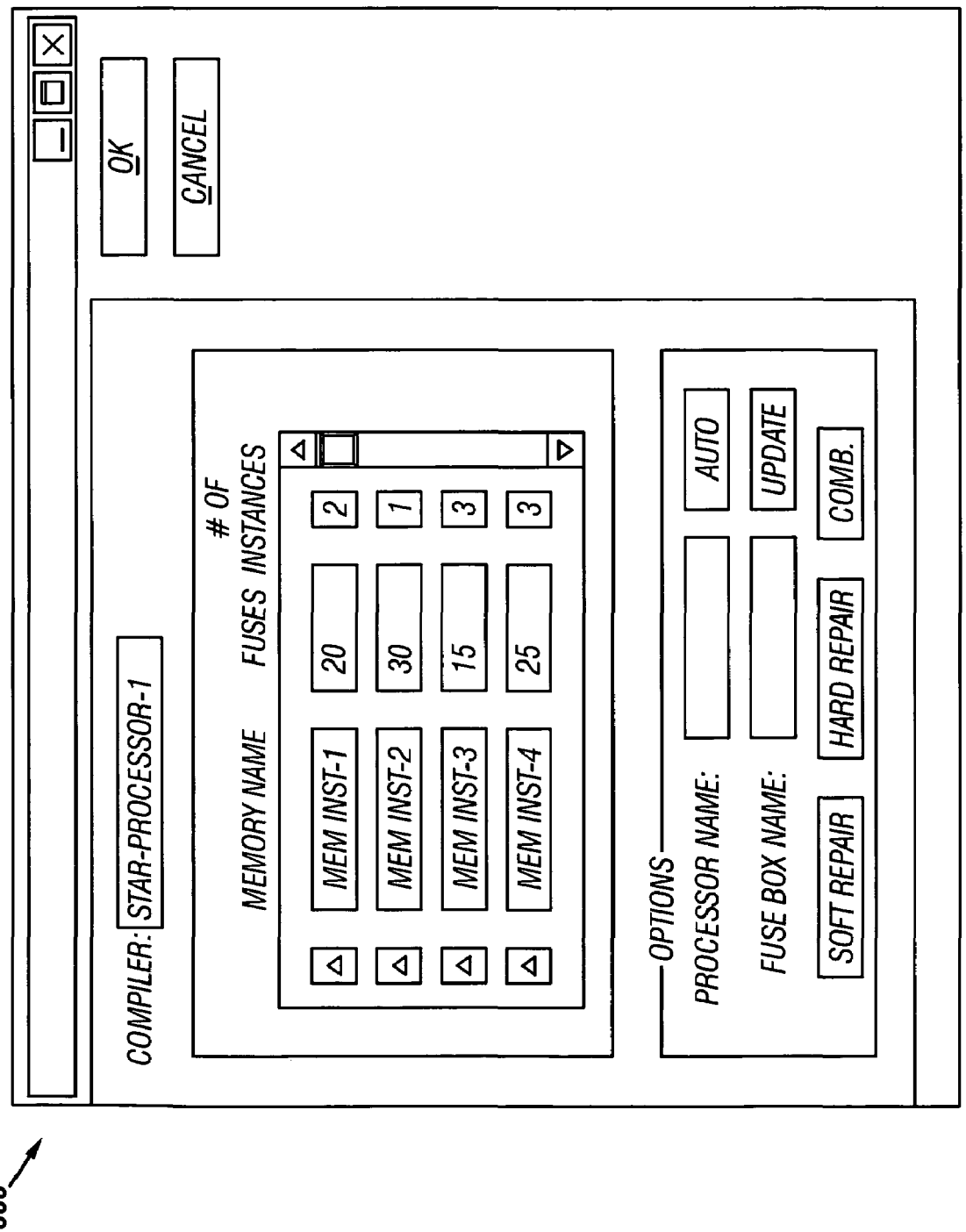
FIG. 8 depicts an exemplary user interface for compiling an ETR processor in accordance with the teachings of the present disclosure.

FIG. 8 depicts an exemplary integrated user interface 800 for specifying the STAR processor configuration in accordance with the teachings of the present disclosure. An appropriate processor compiler is selected (e.g., STAR-PROCESSOR-1), preferably one with the same foundry/process that was specified in the multi-instance memory compiler interface used for generating multiple memory instances with applicable number of fuse elements (in hard repair option).

All instances used in conjunction with the selected processor are specified under MEMORY NAME, which includes the selected memory names, number of fuses, and the number of instances (if multiple numbers of the same memory configuration are used). The UP ("Δ") arrows can be used to change the scan chain order, or the order in which the different memories are tested. After specifying the number of memory instances, an UPDATE button is used as part of the PROCESSOR OPTIONS for updating the number of fuses in the specified memory group. Further, different types of repair can be specified, by choosing either SOFT REPAIR, HARD REPAIR, or a combination of the two.

The following steps highlight an exemplary session for generating a STAR memory system having multiple instances, fuse box, and the ETR processor.

I. Getting Started
Initiate integration application
Click>File
Click>New
Click>Add
Select the foundry of interest
Select the process
Click "Compiler" button and select appropriate STAR memory compiler
Click>Revision
Click>OK
II. Specifying the Memory Configuration(s)
Input NW, NB and COL MUX
Select the Number of Bits in Subword (if enabled)
Input the Frequency at which the instance is supposed to run
Input a memory instance name (or accept the default)
If more instances from the same compiler are required, use the same session to generate additional memory instances
III. Specifying the Fuse Box
Click>Add
Select the foundry/process (same as specified in the memory instance generation)
Click "Compiler" and choose the fuse box
Select the Revision
Click>OK
IV. Specifying the Processor Configuration
Click>Add
Select the foundry/process (same as specified in the memory instance generation)
Select the STAR processor
Select the Revision
If multiple numbers of the same memory configuration are required, specify the number in the "Instances" box
Use Δ arrows to change the order in which the instances are tested
Click "Update" to update the number of fuses
Select soft repair, hard repair, or a combination
Click>OK Based on the foregoing, it should be appreciated that the present disclosure advantageously provides a simple yet efficient and elegant ETR scheme and interface for compiling multiple instances, applicable fuse box assemblies and ETR functionality in an integrated manner. By automatically passing the fuse information via a fuse map, the fuse compiler can accurately configure a fuse assembly of appropriate size that can be varied based on the requirements of a particular memory application. By eliminating the inherent errors associated with the manual process, the possibilities of configuring a redundant memory device with an unmatched fuse array are significantly reduced. In other words, the yield of memory devices is expected to increase as a consequence.

It is believed that the operation and construction of the present disclosure will be apparent from the foregoing Detailed Description. While the method and circuitry shown and described have been characterized as being preferred, it should be readily understood that various changes and modifications could be made therein without departing from the scope of the present disclosure as set forth in the following claims. For example, although the teachings of the present disclosure have been particularly described by way of a fuse compiler and associated interface, those skilled in the art should recognize that the underlying software or computer program code that supports the present disclosure's fuse compiler and interface is comprehended within the claimed subject matter. Additionally, the teachings of the present disclosure can be practiced with different types of memory instances, e.g., SRAM instances, DRAM instances, ROM/EPROM/EEPROM instances, Flash memory instances, embedded SOC devices, and the like. Further, the term "fuse" is not restricted to any particular fuse technology (e.g., laser-blown) and thus should be interpreted to mean any physical layout feature that allows post-fabrication programming for redundancy purposes. Moreover, the compilable memory arrays themselves may include any known architecture, including banking, for example. Accordingly, all such modifications, substitutions, extensions, additions, combinations, et cetera, should be considered to be within the ambit of the present disclosure whose scope is limited solely by the claims appended hereinbelow.

What is claimed is:

1. A computer program product that includes a computer usable medium having computer readable program code for compiling a fuse assembly for a memory, comprising:
   program code operable to define a memory group that includes a plurality of memory instances that are functionally related, each memory instance being characterized by its memory configuration data;
   program code operable to determine a number of fuses required for each memory instance based on its configuration data;
   program code operable to automatically pass fuse information relating to said number of fuses to a fuse compiler; and
   program code operable to generate, based on said fuse information, a fuse box assembly for said memory group, said fuse box assembly having a plurality of fuses organized into a set of fuse segments, each segment corresponding to a particular memory instance of said memory group.

2. The computer program product as set forth in claim 1, wherein said memory configuration data comprises at least one of NW (the number of words), NB (the number of bits) and column MUX information associated with said particular memory instance.

3. The computer program product as set forth in claim 1, wherein said program code operable to determine the number of fuses required for each memory instance includes program code for computing a fuse equation associated with each particular memory instance of said memory group.

4. The computer program product as set forth in claim 1, wherein said memory group includes at least one of a static random access memory (SRAM) instance, an electrically programmable read-only memory (EPROM) instance, a dynamic random access memory (DRAM) instance, and a Flash memory instance.

5. A method for facilitating a fuse assembly compiling process associated with a memory architecture, comprising:
- defining, via a user interface, a memory group including a plurality of memory instances that are functionally related, each memory instance being characterized by its memory configuration data; and
- automatically passing a number of fuses necessary for each memory instance in said memory group to a fuse compiler, wherein said number of fuses required for each memory instance is determined based on its configuration data.

6. The method as set forth in claim 5, wherein said memory configuration data comprises at least one of NW (the number of words), NB (the number of bits) and column MUX information associated with a particular memory instance.

7. The method as set forth in claim 6, wherein said number of fuses required for each memory instance is determined based on computing a fuse equation associated with each particular memory instance of said memory group.

8. The method as set forth in claim 7, wherein said memory group includes at least one of a static random access memory (SRAM) instance, an electrically programmable read-only memory (EPROM) instance, a dynamic random access memory (DRAM) instance, and a Flash memory instance.

* * * * *